United States Patent [19]
Rossi et al.

[11] Patent Number: 5,563,534
[45] Date of Patent: Oct. 8, 1996

[54] HYSTERESIS COMPARATOR CIRCUIT FOR OPERATION WITH A LOW VOLTAGE POWER SUPPLY

[75] Inventors: Domenico Rossi, Cilavegna, Italy; Masayuki Tateoka, Saitamaken, Japan

[73] Assignee: SGS Thomson Microelectronics S.r.l., Agrate-Brianza, Italy

[21] Appl. No.: 240,024

[22] Filed: May 9, 1994

[30] Foreign Application Priority Data

May 7, 1993 [EP] European Pat. Off. ............ 93830193

[51] Int. Cl.$^6$ ................................................ H03K 5/153
[52] U.S. Cl. .............................. 327/77; 327/87; 327/89; 327/205
[58] Field of Search ........................ 327/53, 63, 64, 327/65, 66, 67, 68, 69, 72, 73, 74, 75, 77, 78, 81, 82, 87, 205, 206, 212, 89, 215

[56] References Cited

U.S. PATENT DOCUMENTS

| | | | |
|---|---|---|---|
| 3,987,368 | 10/1976 | Ahmed | 330/30 D |
| 4,032,801 | 6/1977 | Fulkerson | 327/65 |
| 4,105,901 | 8/1978 | Leidich | 327/77 |
| 4,147,944 | 4/1979 | Monticelli | 327/63 |
| 4,401,901 | 8/1983 | Ochi | 327/89 |
| 4,506,176 | 3/1985 | Harris | 327/65 |
| 4,556,838 | 12/1985 | Brasseur | 323/285 |
| 4,572,975 | 2/1986 | Bowers | 307/498 |
| 4,634,897 | 1/1987 | Yoshioka | 327/65 |
| 4,642,484 | 2/1987 | Skovmand et al. | 327/89 |
| 4,947,105 | 8/1990 | Unger et al. | 327/65 |
| 5,099,142 | 3/1992 | Barre | 327/205 |
| 5,115,151 | 5/1992 | Hull et al. | 327/65 |
| 5,126,591 | 6/1992 | Sacchi et al. | 327/77 |
| 5,159,211 | 10/1992 | Fujii | 327/65 |
| 5,182,471 | 1/1993 | Yoshida | 307/355 |
| 5,182,477 | 1/1993 | Yamasaki et al. | 327/65 |
| 5,184,028 | 2/1993 | Zobel | 307/270 |
| 5,189,318 | 2/1993 | Tanaka | 327/65 |
| 5,313,114 | 5/1994 | Poletto et al. | 327/205 |
| 5,319,265 | 6/1994 | Lim | 327/77 |
| 5,321,653 | 6/1994 | Suh et al. | 327/77 |
| 5,367,211 | 11/1994 | Giordano et al. | 327/73 |
| 5,397,935 | 3/1995 | Nitta | 327/65 |

FOREIGN PATENT DOCUMENTS 58-94225 6/1983 Japan ................ H03K 3/02

OTHER PUBLICATIONS

Allen, Gordon and David Harnishfeger, "Voltage Comparator with Hysteresis Suitable for Low, Supply Referenced Thresholds," Motorola Technical Developments, vol. 12, p. 160, Apr. 1991.

Primary Examiner—Timothy P. Callahan
Assistant Examiner—Kenneth B. Wells
Attorney, Agent, or Firm—Seed and Berry LLP; David V. Carlson; Michael J. Donohue

[57] ABSTRACT

A hysteresis comparator circuit working with a low voltage supply and of a type which includes a composite structure incorporating first and second differential cells respectively comprised of an npn bipolar transistor pair with common emitters, on the one side, and a pair of pnp bipolar transistor pair with common emitters, on the other, such cells being coupled together through the bases of the respective transistors. The circuit includes at least one pair of variable current sources associated with each cell and tied operatively to the voltage value present on the comparator output; in addition, a voltage divider is connected between each interconnection of the bases of the transistors forming the cells.

17 Claims, 4 Drawing Sheets

HYSTERESIS COMPARATOR CIRCUIT FOR OPERATION WITH A LOW VOLTAGE POWER SUPPLY

DESCRIPTION

1. Field of Application

This invention relates to an integrated comparator circuit working with a low voltage supply and more particularly to hysteresis comparators.

2. Prior Art

As is well known, comparators circuits are used to compare two DC voltage values with each other, and to output two different set voltage values, according to whether an input signal Vin is higher or lower than a reference voltage Vr. Comparators are used extensively in integrated circuits, e.g., for controlling logic gates.

On the other hand, for certain specific applications, the use of other hysteresis comparators is more appropriate. Hysteresis comparators distinguish themselves from the former type in that the switching between the two output logic values is brought about by different input voltages.

Of course, such hysteresis comparators may also be implemented in integrated circuit form, and a typical example of a prior art integrated comparator is shown in FIG. 1 of the accompanying drawings.

The comparator of FIG. 1 comprises a differential cell input stage which includes a first pair of bipolar transistors T1 and T2, of npn type, connected in a common emitter configuration. The collectors of such transistors are connected to a power supply line at a voltage Vcc=1 Volt, via respective resistors. The bases of these transistors are available to serve as circuit inputs, the one for the reference voltage Vr and the other for the input signal Vin for example. The emitters of transistors $T_1$ and $T_2$ are directly connected to a common terminal. A further transistor $T_3$ connects the common terminal to the ground potential and operates substantially as a constant current generator. The base of transistor $T_3$ receives a bias voltage $V_{bias2}$.

A second pair of bipolar transistors, of the pnp type, are associated with the input stage of the comparator. The bases of the transistors in this second pair are connected together and receive a bias voltage $V_{bias1}$.

The collectors of the first pair of npn transistors T1 and T2 are each connected to the corresponding emitter of the second pair of pnp transistors, respectively.

The comparator output O is taken from the collector of one transistor in the second pair.

The circuit of FIG. 1 exhibits a fairly small dynamic range in the common mode input voltage of about 0.9 Volts. The common mode voltage is the highest voltage that can be input without causing anomalous operation of the comparator.

An improvement of the circuit in FIG. 1 is shown in FIG. 2, where an additional circuit portion is clearly discernible which is basically a follower arrangement and functions as a voltage level shifter.

That circuit portion comprises a third pair of bipolar transistors, of the common base pnp type, which are connected between the supply Vcc and the signal inputs of the comparator. Each of these transistors is coupled to a resistor having one end connected to a corresponding base terminal of the first transistor pair in the input stage.

Thus, the signal will not be applied to the differential stage directly, but supplied thereto through the follower.

The voltage drop across each resistor will hold the bases of the first transistor pair in the input stage at a suitable voltage for proper operation of these transistors.

However, according to the actual value of the common mode voltage at the inputs, a different variation of the voltage across the resistors may be required to keep the transistors operating correctly.

For situations such as this, the prior art has proposed a third solution shown in FIG. 3. The circuit depicted in FIG. 3 is structurally similar to that shown in FIG. 1, except that a second input stage is provided here which comprises a pair of common-emitter pnp bipolar transistors.

In essence, the last-mentioned solution provides a dual differential cell for the input circuit portion, which cell comprises a pair of npn bipolars, on the one side, and a pair of pnp bipolars, on the other. The two pairs are connected in parallel through the bases of their respective transistors.

The first cell is driven by signals at a value close to the supply value Vcc, whereas the second cell operation is referenced to a signal ground value. However, with both transistor pairs in the "off" state, an indefinite condition occurs at the output O.

SUMMARY OF THE INVENTION

The underlying object of this invention is to provide a hysteresis comparator, working with a low voltage, which has such structural and functional features as to overcome the drawbacks of the solutions currently proposed in the prior art and affords expanded dynamic range of the common mode input voltage.

According to principles of the present invention, the comparator comprises at least one pair of variable current sources associated with each differential cell and tied operatively to the comparator output voltage value.

Based on this idea, the technical problem is solved by a comparator as described above and defined in the appended claims of claim 1.

This invention is somewhat similar to the technical approach represented by the third of the solutions discussed hereinabove because it uses more than one differential cell, however, it has significant advantages not provided by this third solution.

The features and advantages of a comparator according to the invention will become apparent from the following description of an embodiment thereof, given by way of example and not of limitation, with reference to the accompanying drawings.

DETAILED DESCRIPTION OF THE PREFERRED EMBODIMENTS

Figure 1:
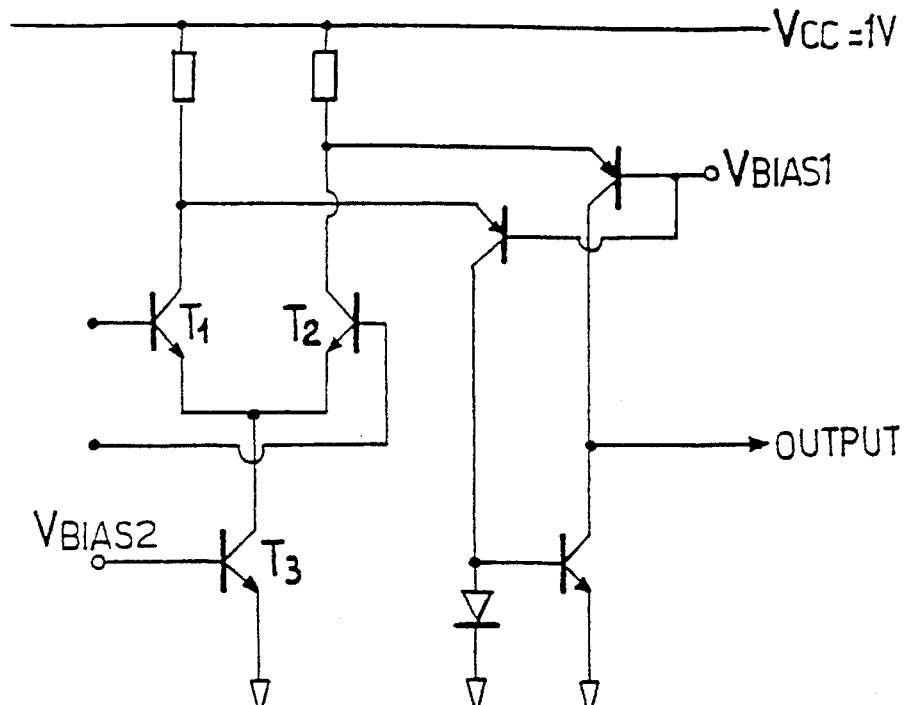
FIG. 1 is a view showing diagrammatically a hysteresis comparator circuit according to the prior art.
Figure 2:
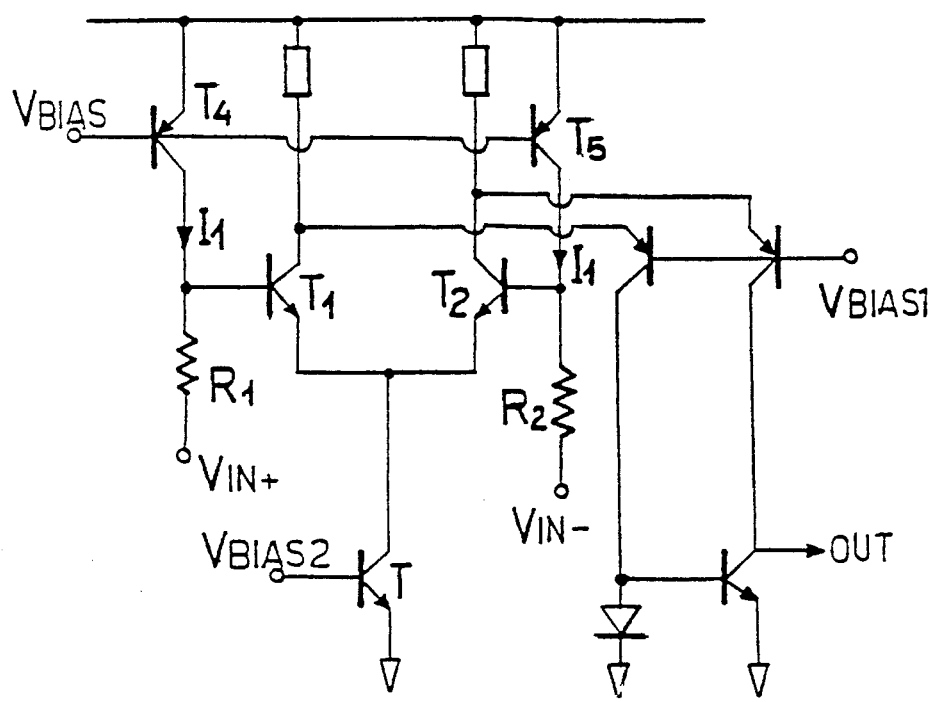
FIG. 2 is a view showing diagrammatically a second hysteresis comparator circuit according to the prior art.
Figure 3:
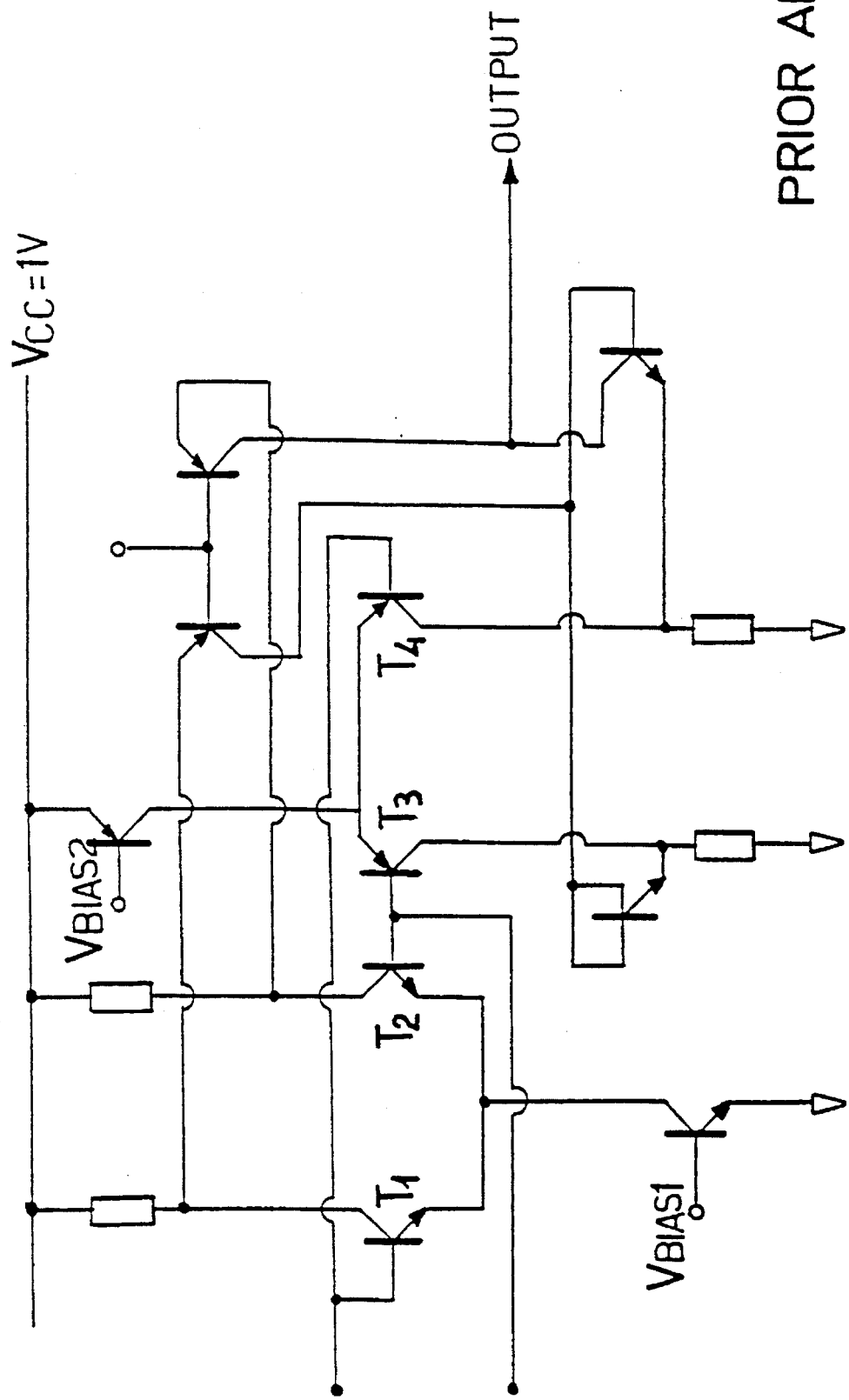
FIG. 3 is a view showing diagrammatically a third hysteresis comparator circuit according to the prior art.
Figure 4:
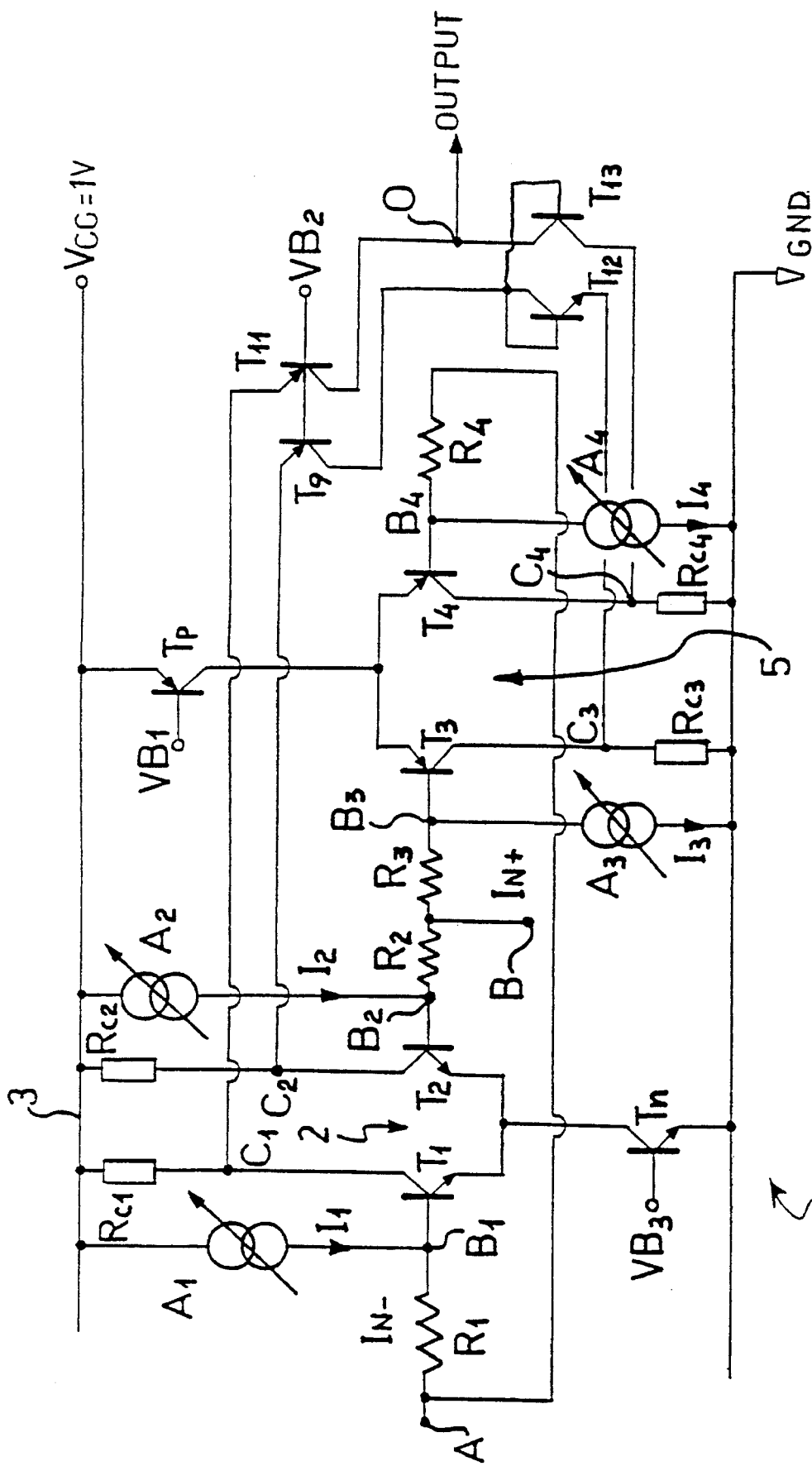
FIG. 4 is a view showing diagrammatically a comparator circuit according to the invention.
Figure 5:
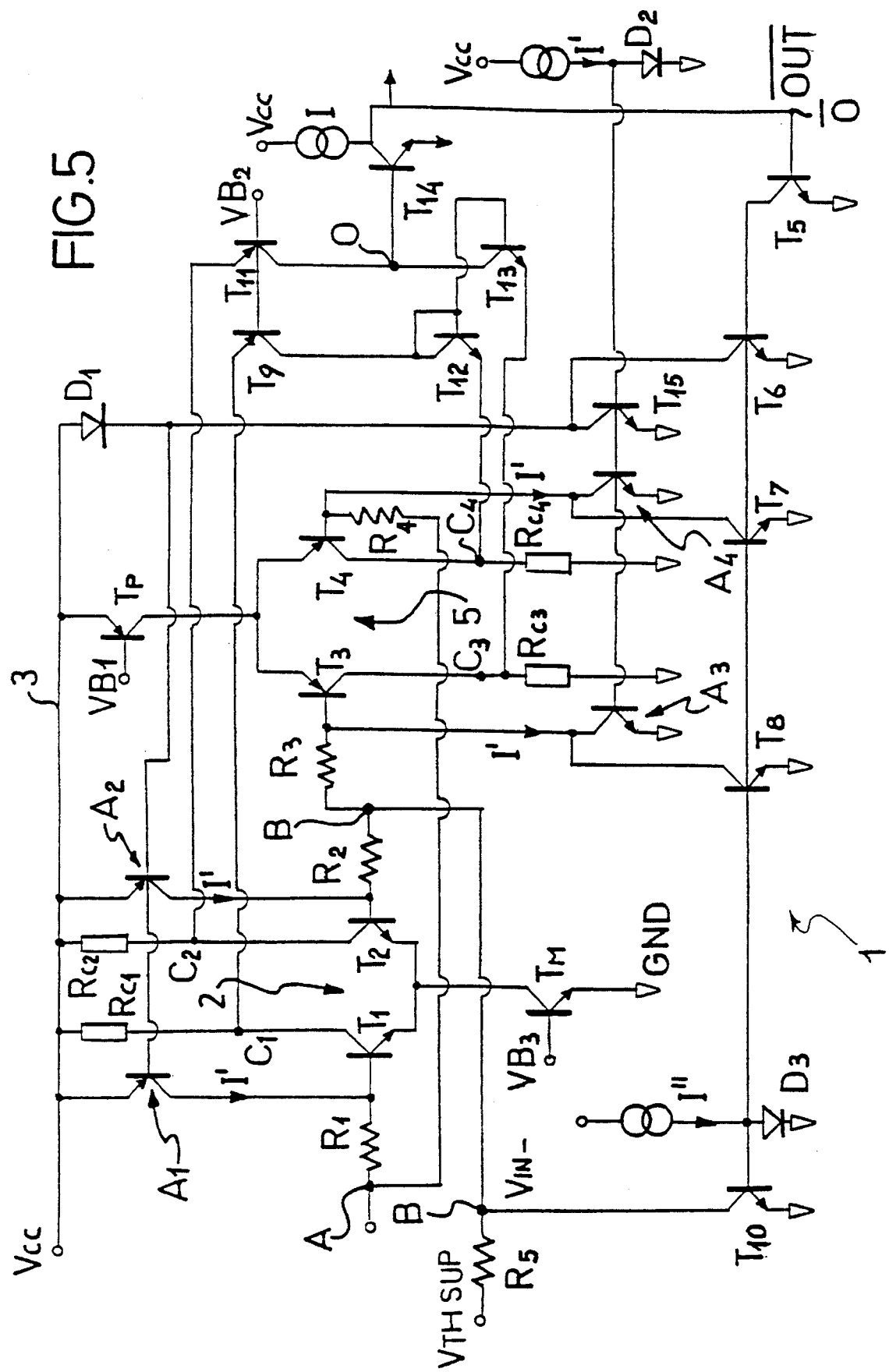
FIG. 5 is a view showing diagrammatically and in greater detail one alternative embodiment of the invention similar in many respects to the circuit of FIG. 4.

With reference to the drawing FIGS. 4 and 5, generally and schematically shown at 1 is a hysteresis comparator circuit embodying this invention.

This comparator 1 comprises a first differential cell including a first pair of npn-type bipolar transistors T1 and T2 which have their respective emitters in common. Those emitters are also connected to a signal ground GND via a bias current source which comprises a transistor Tn on whose base a voltage Vb3 appears.

The collectors C1, C2 of the transistors T1, T2 are connected, through respective resistors Rc1 and Rc2, to a power supply line 3 on which a relatively low voltage value Vcc of 1 Volt is present.

The bases B1, B2 of the transistors T1, T2 are, in turn, connected to the line 3 through respective variable current sources A1, A2. Advantageously, such current sources are controlled by and tied operatively to the value of the voltage at the output O of the comparator.

The circuit 1 further comprises a second differential cell 5 including a second transistor pair. T3 and T4. This second pair is formed by pnp-type bipolars being, in turn, interconnected with their respective emitters.

Those emitters are also connected to the supply line 3 via a bias current source which comprises a transistor Tp at whose base a bias voltage Vb1 appears.

The collectors C3, C4 of the transistors T3, T4 are connected to ground at GND via respective resistors Rc3 and Rc4.

The bases B3, B4 of the transistors T3, T4 are also connected to ground at GND, via respective variable current sources A3, A4. These current sources are also controlled by and tied operatively to the value of the voltage present at the comparator output O.

The two differential cells 2 and 5 are coupled together through respective connections between the bases B1, B4 and the bases B2, B3 of the corresponding transistors.

A voltage divider is connected between each of said base interconnections. Specifically, a first resistor pair R1, R4 are connected between the bases B1, B4, and a second resistor pair R2, R3 are connected between the bases B2 and B3.

Preferably, the resistors R1, R2, R3 and R4 have equal values, as equal values have the currents I1, I2 and I3, I4, respectively.

The point of interconnection of the first resistor pair R1, R4 is the inverting (IN−) input A of the comparator 1.

On the other hand, the point of interconnection of the second resistor pair R2, R3 is the non-inverting (IN+) input B of the comparator 1.

The structure of the circuit 1 is completed by a third pair of pnp-type bipolar transistors T9, T11 having corresponding emitters connected directly to the respective collectors C1, C2 of the first transistor pair T1, T2 in the cell 2. The transistors T9 and T11 have common-base and are supplied by a base voltage VB2.

A fourth bipolar transistor pair T12, T13 of the npn type are provided in association with the second cell 5. Specifically, the transistors T12, T13 which form this fourth pair have corresponding emitters connected directly to the respective collectors C3, C4 of the second transistor pair T3, T4 in the cell 5. The transistors T12 and T13 have common-base, and the first, T12, of them has its base connected to the collector to thereby produce a diode configuration.

The first transistor T9 in the third pair is connected to the first transistor T12 in the fourth pair through the connection between their respective collectors. Likewise, the second transistor T11 in the third pair is connected to the second transistor T13 in the fourth pair through the connection between the respective collectors thereof, and the output O from the comparator circuit 1 is actually taken from the common collector of transistors T11 and T13.

This output O provides a voltage output value Vo.

The operation of the circuit according to the invention will now be described.

The composite, npn and pnp, structure of the cells 2 and 5 is connected to the signal inputs A and B, through the resistors R1, R2, R3, R4 and the variable current sources A1, A2, A3, A4, and provides a shift in logic level whose value is controlled by the state of the output O.

The value of the output O also controls, as with any hysteresis comparators, the switching phase between the two (upper and lower) circuit thresholds.

The current source A1 is suitably sized to ensure proper operation of the first transistor pair in the input stage, and hence an appropriate state of the output O.

Assume that the signal voltage Vin(+) at the non-inverting input B is lower than Vin(−) at the inverting input A. For example, Vin(−) could be equal to the upper threshold $Vth_{sup}$, and the shift level properly selected on the basis of that upper threshold.

Under these conditions, the transistor T1 would operate in the active region until the input voltage Vin(+) attains the upper threshold $Vth_{sup}$.

When this threshold value is exceeded, the voltage Vin(+) will drive the comparator 1 to shift its output to the lower threshold value $Vth_{inf}$.

At this time, the variable source A1, being tied operatively to the output O, is forced to change its outgoing current value by activating the second cell 5 formed by the pnp transistor pair T3 and T4.

This method of operation affords great freedom of selection of the two discrete threshold levels, thereby expanding the dynamic range of the common mode input voltage.

One preferred alternative embodiment of the circuit 1 according to the invention is shown diagrammatically in FIG. 5. Of course, other circuit arrangements could implement the design similar to that of FIG. 4 besides the specific alternative shown in FIG. 5. The specific components shown in FIG. 5 could also be used in the embodiment of FIG. 4.

As can be more clearly seen from FIG. 5, the variable sources A1 and A2 can include pnp bipolar transistors driven through their respective bases. The variable sources A3 and A4 can likewise include npn bipolar transistors.

The output O of the circuit 1 corresponds to the base terminal of an npn transistor T14 having the emitter grounded and the collector connected to the supply Vcc via a current source I.

The collector of this transistor T14 is connected to the base of an npn transistor T5 having the emitter grounded. The base of the transistor T5 also assumes the logic value of inverted output O for the comparator 1.

The collector of the transistor T5 is connected to the respective bases of a set of npn transistors T6, T7, T8 and T10 connected in parallel together, with their emitters grounded. The collectors of the transistors T6 and T7 are in common with those of the respective npn transistors incorporated to the current sources A3 and A4. The transistors T6, T7 and T8 may also be considered to be part of the variable current sources in some embodiments.

The first, T6, in said transistor set has its collector connected to the collector of a further transistor T15, and through the latter, to the base terminals of the pnp transistors incorporated to the current sources A1 and A2. A diode D1 connects that collector to the supply Vcc as well.

In the embodiment of FIG. 5, the collector C1 and the collector C4 are linked to each other; however, the emitter of T9 is connected to the collector C1 and the emitter of T12 is connected to the collector C4 with transistors T9 and T12 connected together. Correspondingly, transistors T11 and T13 are connected to collectors C2 and C3, respectively. The output is still taken from the common collector point between transistors T11 and T13, however, in the alternative embodiment of FIG. 5, this represents an output that is linked between the collectors C2 and C3. An inverted output is also provided in the embodiment of FIG. 5 as shown.

The last-mentioned transistor, T15, which is also an npn bipolar type, has its base in common with those of the transistors incorporated to the current sources A3 and A4 and connected between a current source I' associated with the supply Vcc, and a diode D2 connected to ground.

A similar structure comprising the series of a current source I" and a diode D3, is associated with the base of the transistor T10. The collector of the transistor T10 is connected to the non-inverting input B, whereto the upper voltage threshold value $Vth_{sup}$ is applied via a resistor R5.

Assuming for the lower voltage threshold $Vth_{inf}$ a logic level shift above that required for the upper threshold, then the current source I' will continue to be correlated to this upper threshold value.

Upon the output O attaining a "high" logic level, the corresponding inverted output Ō will be at a logic "low". Under this condition, the current I" is allowed to flow through the diode D3 and will be mirrored by the transistor T10 to generate hysteresis of the circuit.

Through the transistors T6, T7 and T8, the shift in logic level is expanded as required tier the lower threshold $Vth_{inf}$.

Understandably, changes and modifications may be made unto the comparator circuit of this invention without departing from the invention, the scope of the invention being defined in the appended claims.

We claim:

1. An integrated comparator comprising:

an input terminal to receive an input voltage;

a reference terminal to receive a reference voltage;

a first differential cell coupled to said input terminal and said reference terminal and including first and second npn bipolar transistors with the emitters in common;

a second differential cell coupled to said input terminal and said reference terminal and including first and second pnp bipolar transistors with the emitters in common, said first npn and pnp transistors being coupled together and to said input terminal through the bases of their respective transistors, said second npn and pnp transistors being coupled together and to said reference input through the bases of their respective transistors; and at least one pair of variable current sources in each of said differential cells and coupled to said first and second npn transistors and to said first and second pnp transistors to generate a current whose value depends on the voltage value present at the output of the comparator.

2. A comparator according to claim 1, characterized in that the comparator further comprises first and second voltage dividers connected between interconnections of the bases of said first npn and pnp transistors and said second npn and pnp transistors, respectively.

3. A comparator according to claim 2, characterized in that each of said voltage dividers comprises a pair of resistors, said input terminal being connected to a point of interconnection of said resistor pair in said first voltage divider and said reference terminal being connected to a point of interconnection of said resistor pair in said second voltage divider.

4. A comparator according to claim 3, characterized in that the resistors connected in said dividers have equal values.

5. A comparator according to claim 1, characterized in that each of said variable current sources comprises a transistor.

6. A comparator according to claim 5, characterized in that the base of each of said transistors in said variable current sources is coupled to the comparator output.

7. A comparator according to claim 1, characterized in that the variable current sources in said first differential cell are each connected between the base of one of the npn transistors and a low-voltage supply line.

8. A comparator according to claim 1, characterized in that the variable current sources in said second cell are each connected between the base of one of the pnp transistors and a signal ground.

9. A hysteresis comparator circuit comprising:

a first differential stage having a first input coupled to a first voltage input terminal by a first resistance and a second input coupled to a second voltage input terminal by a second resistance;

a second differential stage having a first input coupled to the first voltage input terminal by a third resistance and a second input coupled to the second voltage input terminal by a fourth resistance;

an output terminal coupled to said first differential stage; and first and second variable current sources coupled between a power supply and the first and second inputs of the first differential stage, respectively, and also coupled to said output terminal, the value of the current flowing through the first and second variable current sources being variable based on the state of an output signal at the output terminal.

10. The hysteresis comparator of claim 9, further including:

third and fourth variable current sources coupled to the first and second inputs of the second differential stage, respectively, and also coupled to said output terminal, the value of the current flowing through the third and fourth variable current sources being variable based on the state of the output signal at the output terminal, the first, second, third, and fourth variable current sources providing feedback from the output terminal to the differential stages to alter the input voltage difference at the first and second voltage input terminals that will cause a change in the output state.

11. The hysteresis comparator circuit according to claim 9 wherein each of said first and second resistances have an identical resistance value.

12. The hysteresis comparator circuit according to claim 9 in which each of the variable current sources includes a bipolar transistor having its base operatively coupled to the output terminal.

13. A method of altering the voltage difference between two input terminals that will cause a change in the state of an output of a hysteresis comparator circuit having first and second output states, the method comprising the steps of:

inputting a first voltage to a first input of a first differential input circuit and to a first input of a second differential input circuit in the hysteresis comparator circuit;

inputting a second voltage to a second differential input of said first differential input circuit and to a second input of said second differential input circuit;

generating an output signal from the hysteresis comparator circuit with the state of said output signal being based on a threshold voltage difference between the first and second voltages; and generating a variable bias current applied to said first input of the first differential input circuit, the variable bias current having a first value for said first output state and a second value for said second output state to vary said threshold voltage difference, whereby said threshold voltage difference has a first value when the output of the hysteresis comparator is in said first state and has a second value when the output of the hysteresis comparator is in said second state.

14. The method according to claim 13, further including the step of:

generating at least two variable bias currents that are applied to the inputs of the first differential input circuit to vary said threshold voltage difference between the two input voltages that will cause a change in the state of the output signal.

15. The method according to claim 13, further including the step of:

varying a current applied to the base of a transistor within the first differential input circuit to generate the variable bias current.

16. An integrated comparator working with a low voltage supply comprising:

an input terminal to receive an input voltage;

a reference terminal to receive a reference voltage;

a first differential cell with inputs coupled to said input terminal and said reference terminal respectively;

a second differential cell with inputs coupled to said input terminal and said reference terminal respectively;

a first voltage divider having a point of interconnection connected to said input terminal and coupling said input terminal to said first and second cells;

a second voltage divider having a point of interconnection coupled to said reference terminal and coupling said reference terminal to said first and second cells; and at least one pair of variable current sources in each cell generating a current whose value depends on the voltage value present at the output of the comparator.

17. The comparator of claim 16 wherein each of said first and second voltage dividers comprises first and second resistances, each of said resistances having equal resistance values.

* * * * *